(12) United States Patent
Min

(10) Patent No.: US 9,450,197 B2
(45) Date of Patent: Sep. 20, 2016

(54) FLEXIBLE DISPLAY APPARATUS

(71) Applicant: SAMSUNG DISPLAY CO., LTD., Yongin, Gyeonggi-Do (KR)

(72) Inventor: Jinsic Min, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/617,199

(22) Filed: Feb. 9, 2015

(65) Prior Publication Data

US 2016/0043153 A1 Feb. 11, 2016

(30) Foreign Application Priority Data

Aug. 8, 2014 (KR) .................. 10-2014-0102616

(51) Int. Cl.
 *H01L 27/32* (2006.01)
 *H01L 51/00* (2006.01)

(52) U.S. Cl.
 CPC ....... *H01L 51/0097* (2013.01); *H01L 27/3244* (2013.01); *H01L 2251/5338* (2013.01); *H01L 2251/5369* (2013.01); *H01L 2251/558* (2013.01)

(58) Field of Classification Search
 CPC .................................................. H01L 51/0097
 See application file for complete search history.

(56) References Cited

U.S. PATENT DOCUMENTS

| 7,593,086 B2 | 9/2009 | Jeong et al. | |
|---|---|---|---|
| 8,817,223 B2 | 8/2014 | Lee et al. | |
| 2012/0329249 A1 | 12/2012 | Ahn et al. | |
| 2013/0005116 A1* | 1/2013 | Bedell | H01L 21/304 438/462 |
| 2013/0120329 A1* | 5/2013 | Wang | G02F 1/13452 345/206 |
| 2013/0230664 A1* | 9/2013 | Park | H01L 51/5253 427/523 |

FOREIGN PATENT DOCUMENTS

| JP | 10-153969 | 6/1998 |
|---|---|---|
| JP | 10-333593 | 12/1998 |
| JP | 2003-031615 | 1/2003 |
| JP | 2003-255849 | 9/2003 |
| JP | 2007-027305 | 2/2007 |
| KR | 10-2007-0041130 | 4/2007 |
| KR | 10-2011-0056960 | 5/2011 |
| KR | 10-2013-0000211 | 1/2013 |

* cited by examiner

*Primary Examiner* — Mamadou Diallo
(74) *Attorney, Agent, or Firm* — Lee & Morse, P.C.

(57) ABSTRACT

A flexible display apparatus includes a plurality of pixels on a display area of a flexible substrate. A pad area is on a non-display area of the flexible substrate. A driving integrated circuit is electrically connected to the pad area. A support layer is on a surface of the flexible substrate opposite to a surface facing the driving integrated circuit. An adhesion layer attaches the support layer to the substrate. The adhesion layer has a first thickness in an area corresponding to the driving integrated circuit, and a second thickness in another area. The second thickness is less than the first thickness.

20 Claims, 5 Drawing Sheets

FLEXIBLE DISPLAY APPARATUS

CROSS-REFERENCE TO RELATED APPLICATION

Korean Patent Application No. 10-2014-0102616, filed on Aug. 8, 2014, and entitled, "Flexible Display Apparatus," is incorporated by reference herein in its entirety.

BACKGROUND

1. Field

One or more embodiments described herein relate to a flexible display apparatus.

2. Description of the Related Art

A flexible display has been developed which may be bent or rolled up. This display includes a display unit on a thin and flexible substrate. The display unit displays images based on a signal applied from a driving integrated circuit.

The driving integrated circuit may be mounted on a display panel using a chip-on-glass (COG) method, a tape carrier package (TCP) method, or a chip-on-film (COF) method. The COG method is preferred to the TCP and COF methods because the COG method is simpler than the TOP and COF methods.

In the COG method, a rigid driving integrated circuit is placed on a glass having a circuit pattern. The rigid driving integrated circuit is then heated and pressed to mount the integrated circuit on the glass. When the driving integrated circuit is pressed on the glass, the glass is not transformed in terms of its shape because the glass is also rigid. The driving integrated circuit may therefore be effectively mounted on the glass.

However, when pressure is applied to attach a driving integrated circuit on a flexible display, the area of the flexible display to which the driving integrated circuit is attached is compressed. Because of the flexible properties of this type of display, the driving integrated circuit may not be securely attached. As a result, a malfunction may occur, e.g., a failure to supply current to the driving integrated circuit may occur.

SUMMARY

In accordance with one embodiment, a flexible display apparatus includes a flexible substrate, a plurality of pixels on a display area of the flexible substrate, a pad area on a non-display area of the flexible substrate; a driving integrated circuit electrically connected to the pad area, a support layer on a surface of the flexible substrate opposite to a surface facing the driving integrated circuit, and an adhesion layer attaching the support layer to the substrate. The adhesion layer has a first thickness in an area corresponding to the driving integrated circuit and a second thickness in another area, and wherein the second thickness is less than the first thickness.

The first thickness may be less than 12% of the second thickness. The support layer may project from the first area toward the flexible substrate. An upper surface of the adhesion layer may be substantially flat. The substrate may include a concave area in the first area. The driving integrated circuit may be within the concave area.

The pad area may include a plurality of pads, and the driving integrated circuit may include an integrated circuit chip and a plurality of bumps electrically connected to the plurality of pads. The pad area may be coupled to the driving integrated circuit by a conducting film. The conducting film may include an adhesive insulating resin layer and conductive balls dispersed in the adhesive insulating resin layer, each of the conductive balls may have the diameter of about 2 μm to about 4 μm, and the plurality of pads and the plurality of bumps may be electrically connected via the conductive balls.

The first thickness may be less than an average diameter of the conductive balls. The adhesion layer may include one or more getters. The flexible substrate may be a single layer including polyimide. The support layer may include at least one of polyethyleneterepthalate (PET), polystyrene (PS), polyethylene napthalate (PEN), polyethersulfone (PES), or polyethylene (PE).

Each pixel includes an organic light-emitting device, and a thin film transistor electrically connected to the organic light-emitting device. The thin film transistor may include an active layer, a gate electrode, a source electrode, and a drain electrode, and the pad area may include a same material as the source electrode and the drain electrode. The apparatus may include an encapsulation layer encapsulating the display area, wherein the encapsulation layer may include an inorganic layer and an organic layer.

In accordance with another embodiment, a display includes a flexible substrate; a support layer on the flexible substrate; an integrated circuit on the flexible substrate; and an adhesion layer between the support layer and the flexible substrate, wherein the adhesion layer has a first thickness in an area corresponding to the integrated circuit and a second thickness in another area, the second thickness different from the first thickness in a second area. The second thickness may be less than the first thickness. The support layer and the integrated circuit may be on opposing surfaces of the flexible substrate. The display may include an intermediate layer between the integrated circuit and the flexible substrate, the intermediate layer may including conductive particles dispersed throughout a host material.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
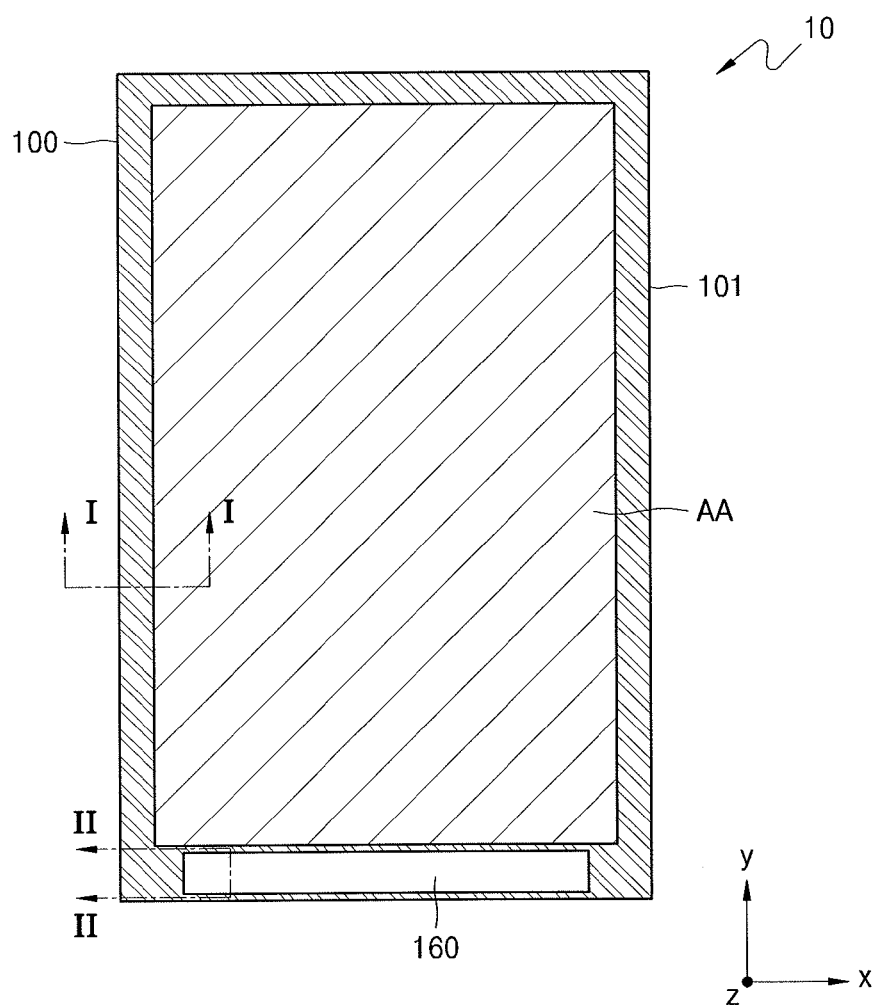
FIG. 1 illustrates an embodiment of a flexible display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
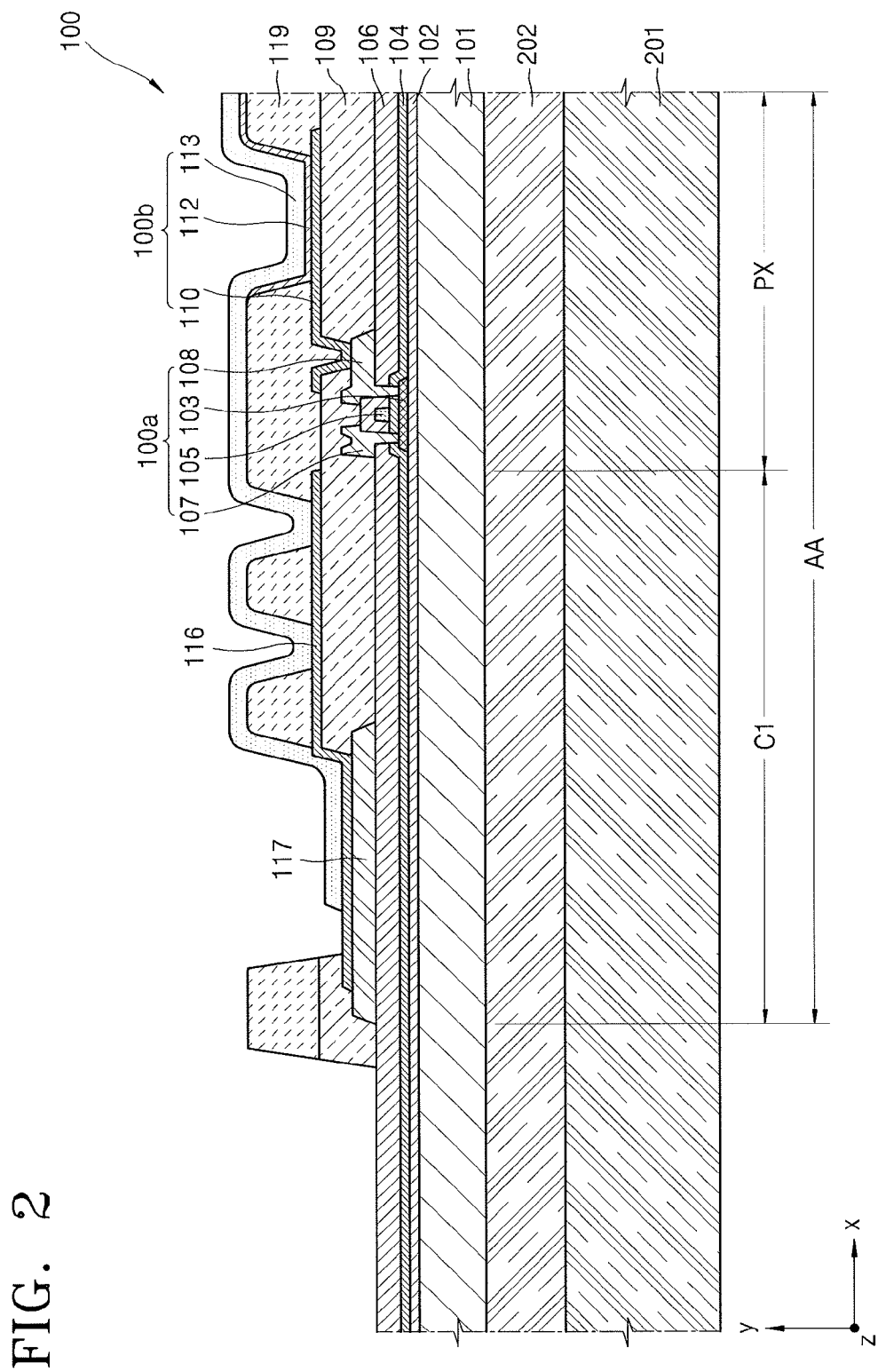
FIG. 2 illustrates an example of the display along section line I-I in FIG. 1.
Figure 3:
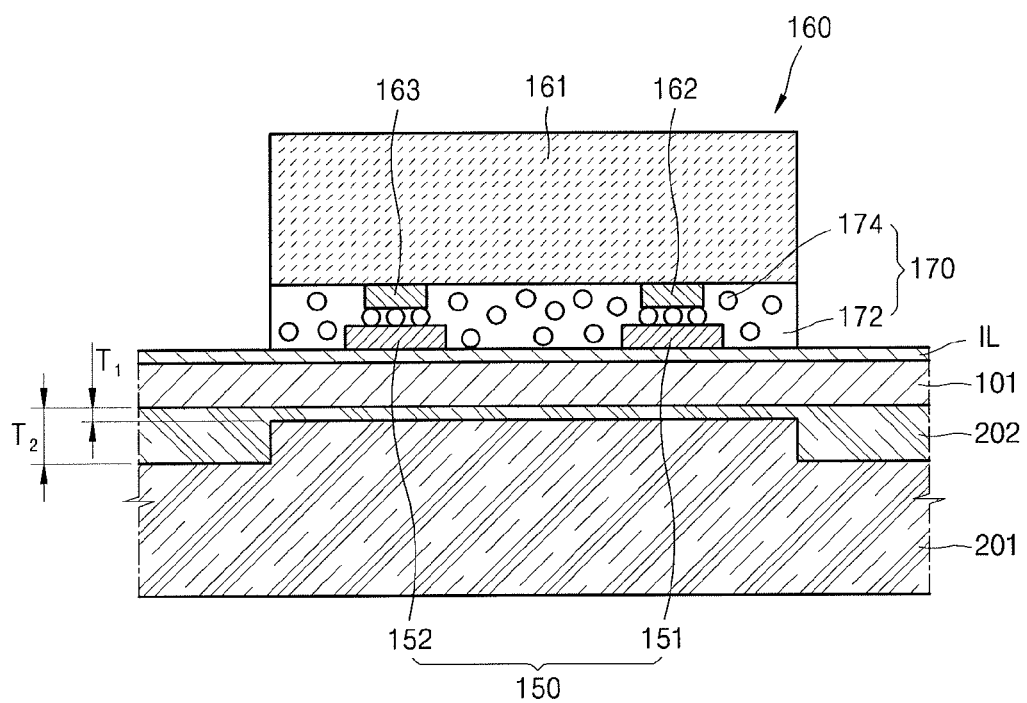
FIG. 3 illustrates an example of the display along section line II-II in FIG. 1.

FIG. 1 illustrates an embodiment of a flexible display apparatus 10. FIG. 2 illustrates one example of a cross-sectional structure the flexible display apparatus 10 taken along line I-I in FIG. 1. FIG. 3 is another example of a cross-sectional structure of the flexible display apparatus 10 taken along line II-II of FIG. 1.

Referring to FIGS. 1 to 3, the flexible display apparatus 10 includes a flexible display panel 100 and a driving integrated circuit 160, which applies an electric signal to the flexible display panel 100. The flexible display panel 100 includes a display area AA to display an image and a pad unit 150. The pad unit has a plurality of pads 151 and 152 outside the display area AA.

A circuit unit C1 that applies an electric signal to a plurality of pixel units PX may be inside the display area. Each of the pixel units PX may include a thin film transistor 100a and an organic light-emitting device 100b. The circuit unit C1 may include various circuit patterns such as but not limited to a power supply pattern and an electrostatic prevention pattern.

The thin film transistor 100a may be on a first surface of a substrate 101, and may include an active layer 103, a gate electrode 105, a source electrode 107, and a drain electrode 108.

The substrate 101 may be a flexible substrate made of a flexible material, e.g., plastic. For example, the substrate 101 may include one or more of polyethersulphone (PES), polyacrylate (PAR), polyetherimide (PEI), polyethylene napthalate (PEN), polyethyleneterepthalate (PET), polyphenylene sulfide (PPS), polyallylate, polyimide (PI), polycarbonate (PC), or poly(aryleneether sulfone), or a combination thereof.

Among these examples, polyimide (PI) has a significant mechanical strength and flexibility and a high heat resistance, e.g., one that can withstand a maximum possible temperature (e.g., about 450° C.) during a manufacturing process. Because of this high heat resistance, the substrate 101 is not deformed by heat generated during a heating process during manufacture, or by the weight of devices and layers formed on the substrate 101 during processes for forming the thin film transistor 100a and the organic light-emitting device 100b on the substrate 101. The flexible display panel 100 may therefore be manufactured in a stable manner.

A buffer layer 102 prevents foreign material from infiltrating through the substrate 101, and also provides a flat surface on the upper portion of the substrate 101. The buffer layer 102 may be formed of a variety of materials that are suitable for the above-described functions. For example, the buffer layer 102 may include one or more inorganic materials including but not limited to silicon oxide, silicon nitride, silicon oxynitride, aluminum oxide, aluminum nitride, or titanium oxide or titanium nitride, and/or one or more organic materials including but not limited to polyimide, polyesther, or acryl. The buffer layer 102 may have a multi-layer structure in one embodiment.

The active layer 103 may include, for example, an inorganic semiconductor material such as amorphous silicon or polysilicon, an organic semiconductor, or an oxide semiconductor The active layer 103 includes a channel area between a source area and a drain area.

If the active layer 103 includes polysilicon, various crystallization methods may be used to form the active layer. Examples of these methods include a rapid thermal annealing (RTA) process, a solid phase crystallization (SPC) method, an excimer laser annealing (ELA) method, a metal induced crystallization (MIC) method, a metal induced lateral crystallization (MILC) method, or a sequential lateral solidification (SLS) method. One or more of these methods may be used to form amorphous silicon and to convert the amorphous silicon into polysilicon by crystallization.

If the substrate 101 is or includes a plastic substrate using polyimide, a low temperature poly-silicon (LTPS) process may be used as a crystallization method. The LTPS process may prevent the substrate 101 from being exposed to high temperature of 300° C. or greater by irradiating a laser beam for a short time during crystallizing amorphous silicon.

A gate insulating layer 104 is on the upper portion of the active layer 103. The gate insulating layer 104 may include an organic material or an inorganic material (e.g., $SiN_x$, or $SiO_2$) and services to insulate the active layer 103 and the gate electrode 105.

A gate electrode 105 is on a predetermined area of the upper portion of the gate insulating layer 104. The gate electrode 105 is connected to a gate line that applies an on/off signal to the thin film transistor 100a. The gate electrode 105 may include one or more of gold (Au), silver (Ag), copper (Cu), nickel (Ni), platinum (Pt), palladium (Pd), aluminum (Al), or molybdenum (Mo), or alloys such as Al:Nd or Mo:W alloy.

An interlayer insulating layer 106 is on the gate electrode 105. The interlayer insulating layer 106 may include an inorganic material (e.g., $SiN_x$, or $SiO_2$) to insulate the gate electrode 105 from the source electrode 107 and the drain electrode 108. The source electrode 107 and the drain electrode 108 are on the interlayer insulating layer 106. The source electrode 107 and the drain electrode 108 may include one or more metals such as Al, Pt, Pd, Ag, magnesium (Mg), Au, Ni, neodymium (Nd), iridium (Ir), chromium (Cr), Li, calcium (Ca), Mo, titanium (Ti), tungsten (W), or Cu.

The interlayer insulating layer 106 and the gate insulating layer 104 may include holes that expose the source area and the drain area of the active layer 103 to the source electrode 107 and drain electrode 108, so that the source electrode 107 and the drain electrode 108 contact the source area and the drain area of active layer 103 through the holes.

FIG. 2 illustrates an example of the thin film transistor 100a that is a top-gate type including the active layer 103, the gate electrode 105, the source electrode 107, and the drain electrode 108 in sequence. The gate electrode 105 may be under the active layer 103. The thin film transistor 100a is electrically connected to an organic light-emitting device 100b to drive the organic light-emitting device 100b, and a planarization layer 109 covers the thin film transistor 100a for protection.

The planarization layer 109 may include an organic insulating layer and/or an organic insulating layer. The inorganic insulating layer may include, for example, one or more of $SiO_2$, SiNx, SiON, $Al_2O_3$, $TiO_2$, tantalum oxide ($Ta_2O_5$), $HfO_2$, $ZrO_2$, BST, or PZT. The organic insulating layer may include, for example, one or more commercial polymers such as poly-methyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, or a vinyl alcohol-based polymer, or a blend thereof. Also, the planarization layer 109 may be formed in a composite laminate of the inorganic insulating layer and the organic insulating layer.

The organic light-emitting device 100b is on the planarization layer 109. The organic light-emitting device 100b may include an intermediate layer 112 between a pixel electrode 110 and a common electrode 113. The pixel electrode 110 may be on the planarization layer 109, and electrically connected to the drain electrode 108 by passing through the planarization layer 109.

The pixel electrode 110 may be a reflective electrode. The pixel electrode 110 may include a reflective film including one or more of Ag, Mg, Al, Pt, Pd, Au, Ni, Nd, Ir, or Cr, or a compound thereof, and a transparent or translucent electrode layer on the reflective film. The transparent or translucent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO).

A pixel defining layer 119 is on the pixel electrode 110 as an insulating material. The pixel defining layer 119 may include one or more organic insulating materials such as but not limited to polyimide, polyamide, acrylic resin, benzocyclobutene, or phenol resin. The pixel defining layer 119 exposes a predetermined area of the pixel electrode 110 to define an area where the intermediate layer 112 is formed. The intermediate layer 112 may include an organic emission layer in the exposed area.

The organic emission layer in the intermediate layer 112 may include a low molecular weight organic material or a high molecular weight organic material. The intermediate layer 112 may include a functional layer, for example, one or more of a hole transport layer (HTL), a hole injection layer (HIL), an electron transport layer (ETL), or an electron injection layer (EIL), as well as the organic emission layer in a selective manner.

The common electrode 113 may be a transparent or translucent electrode The common electrode 113 may include a metal thin film which includes, for example, one or more of Li, Ca, LiF/Ca, LiF/Al, Al, Ag, or Mg, or a compound thereof, and which has a small work function. Also, an auxiliary electrode layer or a bus electrode may be formed with a material for forming a transparent electrode, e.g., ITO, IZO, ZnO or $In_2O_3$, on the metal thin film.

Thus, the common electrode 113 may transmit light emitted from an organic emission layer in the intermediate layer 112. In other words, the light emitted from the organic emission layer may be emitted directly to the common electrode 113, or may be reflected by the pixel electrode 110 that includes a reflective electrode. Then, the reflected light may be emitted to the common electrode 113.

In another embodiment, the flexible display apparatus 10 may be different from a front-surface light-emitting type, e.g., may be a rear-surface light-emitting type that emits the light from the organic emission layer toward the substrate 101. In this case, the pixel electrode 110 may include a transparent or translucent electrode, and the common electrode 113 may include a reflective electrode. Also, according to one embodiment, the flexible display apparatus 10 may be a both-surface light-emitting type that emits light from both the front and the rear surfaces.

A circuit unit C1 may include a circuit line 116 and a power line 117, and may also include various circuit patterns such as an electrostatic prevention pattern. The circuit line 116 may include, for example, a same material as the pixel electrode 110 and may be connected to the common electrode 113. The power line 117 may include a same material as the source electrode 107 or the drain electrode 108.

An encapsulation layer may be on a first surface of the substrate 101 to encapsulate the display area AA. The encapsulation layer may have a layered structure of an inorganic layer and an organic layer. For example, the inorganic layer may include an inorganic material, for example, one or more of $AlO_x$, $TiO_2$, $ZrO$, $SiO_x$, AlON, AlN, $SiN_x$, $SiO_xN_y$, $InO_x$, or $YbO_x$. The organic layer may include, for example, one or more of an acryl-based resin, epoxy-based resin, silicon-based resin, allyl-based resin, polyimide, or polyethylene.

The pad unit 150 may be outside the display area AA on the first surface of the substrate 101. The pad unit 150 may include, for example, a same material as the source electrode 107 and drain electrode 108. The pad unit 150 may include an input pad 151 and an output pad 152. A plurality of input pads 151 and output pads 152 may be arranged in a width direction of the flexible display apparatus 10.

The flexible display panel 100 may include a support layer 201 and an adhesion layer 202. The support layer may be on a second surface opposite to the first surface of the substrate 101. The adhesion layer 202 may attach the support layer 201 to the second surface.

The support layer 201 adds thickness to the flexible display panel 100 for easier handling and may also prevent damage to (e.g., tearing of) the flexible display panel 100. The support layer 201 may include at least one of polyethyleneterepthalate (PET), polystyrene (PS), polyethylene napthalate (PEN), polyethersulphone (PES), or polyethylene (PE).

The adhesion layer 202 is between the substrate 101 and the support layer 201, and adheres the support layer 201 to the substrate 101. The adhesion layer 202 may be include, for example, a pressure sensitive adhesive (PSA). Also, the adhesion layer 202 may include getters dispersed in the adhesion layer 202. In this regard, the substrate 101 may prevent infiltration of moisture, oxygen, and the like, through the second surface of the substrate 101.

The driving integrated circuit 160 is electrically connected to the pad unit 150 and applies electrical signals to the pad unit 150. The driving integrated circuit 160 may include a plurality of bumps 162 and 163 electrically connected to an integrated circuit chip 161 and the plurality of pads 151 and 152.

The driving integrated circuit 160 may be mounted on the substrate 101 using, for example, a Chip-On-Glass (COG) method. A conducting film 170 may be between the driving integrated circuit 160 and the first surface of the substrate 101, and then pressure may be applied thereto under a predetermined temperature to mount the driving integrated circuit 160 on the substrate 101. This method does not need a printed circuit board. Thus, high density and a larger display area AA may be achieved.

An insulating layer IL may be formed on the first surface of the substrate 101. The insulating layer IL may be, for example, the buffer layer 102, the gate insulating layer 104, and the interlayer insulating layer 106.

A conducting film 170 may be, for example, an anisotropic conductive film (ACF) including conductive balls 174 dispersed in an adhesive insulating resin layer 172. The adhesive insulating resin layer 172 may be a film, for example, including one or more of an epoxy resin, an acryl resin, a polyimide resin, or a polycarbonate resin. The conductive balls 174 may include highly conductive materials, such as but not limited to one or more of gold, silver, nickel, or copper.

The conductive balls 174 may have predetermined diameters, e.g., about 2 μm to about 4 μm. The conductive balls 174 may contract to 80% of their original diameter by pressure after a thermo compression bonding. Thus, the aforementioned diameter of the conductive balls 174 may refer to the diameter of conductive balls 174 after the thermo compression bonding is performed to mount the driving integrated circuit 160 on the substrate 101. If the conductive balls 174 have an oval shape after the thermo compression bonding, the diameter of each of the conductive balls 174 may correspond to the length along the short axis. Otherwise, the diameter of the conductive balls 174 may correspond to the shortest distance.

In some but not all circumstances, if the diameters of the conductive balls 174 is more than 4 μm, a short may occur among the plurality of input pads 151 or among the plurality of output pads 152 formed in a width direction of the flexible display apparatus 10. Also, in some but not all circumstances, the diameters of the conductive balls 174 is less than 2 μm, the driving integrated circuit 160 and the pad unit 150 may not sufficiently contact each other, if at all, or the resistance between the driving integrated circuit 160 and the pad unit 150 may increase when connected.

The driving integrated circuit 160 may be mounted on the substrate 101, for example, by the thermo compression bonding. The current may be supplied between the input pad 151 of the pad unit 150 and the input bump 162 of the driving integrated circuit 160, and between the output pad 152 of the pad unit 150 and the output bump 163 of the driving integrated circuit 160, via the conductive balls 174.

Because of the flexibility of the flexible display panel 100, the flexible display panel 100 may be pressed by the driving integrated circuit 160 during the thermo compression bonding, which is performed to mount the driving integrated circuit 160 on the substrate 101.

The adhesion layer 202 may contract during the thermo compression bonding process used to mount the driving integrated circuit 160, and thereby cause a failure in supplying current between the driving integrated circuit 160 and the pad unit 150. This may occur because the adhesion layer 202 has much softer characteristic than the conductive balls 174, the insulating layer IL, the substrate 101, and the support layer 201 under the driving integrated circuit 160.

To prevent the aforementioned issue, the adhesion layer 202 may have a first thickness T1 of a first area and a second thickness T2 of another area. The first area is an area corresponding to the driving integrated circuit 160, and the thickness T1 of the first area may be thinner than the second thickness T2.

The first thickness T1 may be less than the average diameter of the conductive balls 174. For example, the diameter of each of the conductive balls 174 may be, as described above, about 2 μm to about 4 μm. Thus, the first thickness T1 may be less than 3 μm. If the first thickness T1 is less than the average diameter of the conductive balls 174, a failure where current is not supplied between the driving integrated circuit 160 and the pad unit 150 may be prevented, even when the adhesion layer 202 is compressed to the first thickness T1 during mounting of the driving integrated circuit 160.

The second thickness T2 of the adhesion layer 202 may have a predetermined thickness (e.g., about 25 μm) to fully adhere the support layer 201 to the substrate 101. The first thickness T1 may be, for example, less than 12% of the first thickness T1.

The support layer 201 may have a convex shape projected toward the substrate 101 from an area on which the driving integrated circuit 160 is mounted. Accordingly, the adhesion layer 202 may be easily formed to have a flat upper surface, while having the first thickness T1 only in the first area. Also, as the thickness of the support layer 201 (in the area on which the driving integrated circuit 160 is mounted) increases, the support layer 201 may have sufficient strength to withstand the pressure applied during mounting of the driving integrated circuit 160. Thus, the driving integrated circuit 160 may be effectively attached to the substrate 101.

Figure 4:
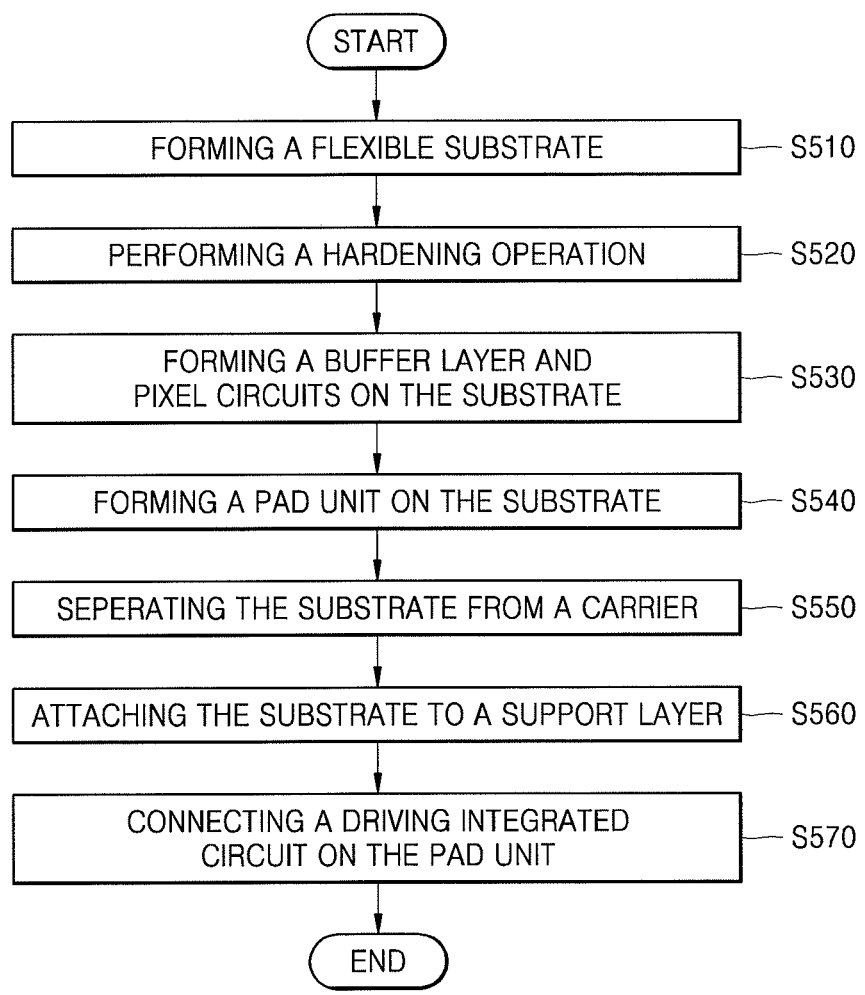
FIG. 4 illustrates a method for manufacturing a flexible display apparatus.

FIG. 4 illustrates an embodiment of a method for manufacturing a flexible display apparatus, which, for example, may be flexible display apparatus 10. The method includes forming the substrate 101 by coating a predetermined material (e.g., polyimide) to a predetermined thickness on a carrier substrate formed of a rigid material (e.g., glass) (S510). Then, the polyimide is hardened (S520). Subsequently, the buffer layer 102 is formed on the substrate 101, and the thin film transistor 100a and the organic light-emitting device 100b are formed thereon (S530). Then, the encapsulation layer is formed to encapsulate the display area AA. The pad unit 150 may be formed when the source electrode 107 and the drain electrode 108 of the thin film transistor 100a are formed (S540).

Next, the carrier substrate is separated from the substrate 101 (S550). The carrier substrate may be separated from the substrate, for example, by irradiating a laser beam from under the carrier substrate. Then, the flexible display panel 100 is manufactured by separating the substrate 101 from the carrier substrate, and then attaching the substrate 101 to the support layer 201 coated with the adhesion layer 202 (S560).

Finally, the driving integrated circuit 160 is connected to (e.g., mounted on) the pad unit 150 using, for example, the chip-on-glass (COG) method (S570). The adhesion layer 202 has the first thickness T1 in the area on which the driving integrated circuit 160 is mounted. The support layer 201 has a predetermined (e.g., a convex shape) projected toward the substrate 101 from the area on which the driving integrated circuit 160 mounted.

Therefore, even though the driving integrated circuit 160 is mounted on the flexible display panel 100 using chip-on-glass (COG) method, the adhesive strength and electrical conductivity between the driving integrated circuit 160 and the pad unit 150 may be sufficiently strong.

Figure 5:
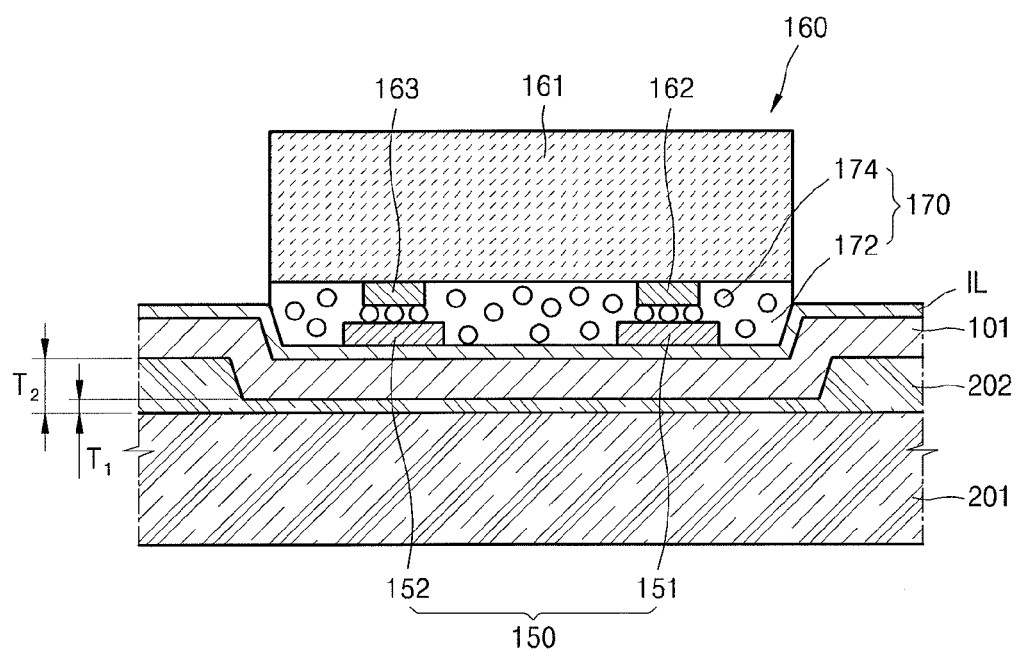
FIG. 5 illustrates another example of the display along section line II-II in FIG. 1.

FIG. 5 illustrates the cross-sectional structure of another example of the flexible display apparatus 10 taken along line II-II in FIG. 1. Referring to FIG. 5, the insulating layer IL may be on the first surface of the substrate 101, and the support layer 201 may be attached to the second surface of the substrate by the adhesion layer 202.

The driving integrated circuit 160 may be mounted on the substrate 101 using a chip-on-glass (COG) method. For example, a conducting film 170 is between the driving integrated circuit 160 and the first surface of the substrate 101, and then pressure is applied thereto under a high temperature to mount the driving integrated circuit 160 on the substrate 101.

The conducting film 170 includes the adhesive insulating resin layer 172 and the conductive balls 174 dispersed in the adhesive insulating resin layer 172. The input pad 151 of the pad unit 150 and the input bump 162 of the driving integrated circuit 160 are electrically connected via the conductive balls 174. The output pad 152 of the pad unit 150 and the output bump 163 of the driving integrated circuit 160 are electrically connected via the conductive balls 174.

The adhesion layer 202 may have a first thickness T1 in the first area on which the driving integrated circuit 160 is mounted, and a second thickness T2 greater than the first thickness T1 in another area, in order to increase the adhesive strength between the substrate 101 and the support layer 201.

For example, the first thickness T1 may be less than 12% of the second thickness T2, and less than an average diameter of the conductive balls 174. Therefore, the conductive balls 174, which have an average diameter greater than the first thickness T1, may prevent a failure from occurring in which current is not supplied between the driving integrated circuit 160 and the pad unit 150, even when the adhesion layer 202 is compressed to the first thickness T1 during mounting of the driving integrated circuit 160, for example, by thermo compression bonding.

The substrate 101 may include a concave portion in the first area. The concave portion may be formed larger than the driving integrated circuit 160. The substrate 101 including the concave portion may be easily formed in the above mentioned process for manufacturing the flexible display apparatus 10, for example, by coating the polyimide to a predetermined thickness on a carrier substrate that has a concave portion, and then hardening the polyimide.

If the substrate 101 includes a portion that is bent concavely, the adhesion layer 202 may be formed to have a first thickness T1 only in the first area when the support layer 201 is attached to the second surface of the substrate 101. Also, when mounting the driving integrated circuit 160, the driving integrated circuit 160 may be easily deposited and stably maintained because the driving integrated circuit 160 may be positioned in the concave portion.

In accordance with one or more of the aforementioned embodiments, the driving integrated circuit and the flexible display panel may be strongly adhesive to each other, even when using the COG method.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A flexible display apparatus, comprising:
   a flexible substrate;
   a plurality of pixels on a display area of the flexible substrate;
   a pad area on a non-display area of the flexible substrate;
   a driving integrated circuit electrically connected to the pad area;
   a support layer on a surface of the flexible substrate opposite to a surface facing the driving integrated circuit; and
   an adhesion layer attaching the support layer to the flexible substrate, wherein the adhesion layer has a first thickness in an area corresponding to the driving integrated circuit and a second thickness in another area, and wherein the first thickness is less than the second thickness.

2. The apparatus as claimed in claim 1, wherein the first thickness is less than 12% of the second thickness.

3. The apparatus as claimed in claim 1, wherein the support layer projects from the first area toward the flexible substrate.

4. The apparatus as claimed in claim 3, wherein an upper surface of the adhesion layer is substantially flat.

5. The apparatus as claimed in claim 1, wherein the flexible substrate includes a concave area in the first area.

6. The apparatus as claimed in claim 5, wherein the driving integrated circuit is within the concave area.

7. The apparatus as claimed in claim 1, wherein:
   the pad area includes a plurality of pads,
   the driving integrated circuit includes an integrated circuit chip and a plurality of bumps electrically connected to the plurality of pads, and
   the adhesion layer has the second thickness in the display area.

8. The apparatus as claimed in claim 7, wherein the pad area is coupled to the driving integrated circuit by a conducting film.

9. The apparatus as claimed in claim 8, wherein:
   the conducting film includes an adhesive insulating resin layer and conductive balls dispersed in the adhesive insulating resin layer,
   each of the conductive balls has the diameter of about 2 μm to about 4 μm, and
   the plurality of pads and the plurality of bumps are electrically connected via the conductive balls.

10. The apparatus as claimed in claim 9, wherein the first thickness is less than an average diameter of the conductive balls.

11. The apparatus as claimed in claim 1, wherein the adhesion layer includes one or more getters.

12. The apparatus as claimed in claim 1, wherein the flexible substrate is a single layer including polyimide.

13. The apparatus as claimed in claim 1, wherein the support layer includes at least one of polyethyleneterephtalate (PET), polystyrene (PS), polyethylene napthalate (PEN), polyethersulfone (PES), or polyethylene (PE).

14. The apparatus as claimed in claim 1, wherein each pixel includes:
   an organic light-emitting device, and
   a thin film transistor electrically connected to the organic light-emitting device.

15. The apparatus as claimed in claim 14, wherein:
   the thin film transistor includes an active layer, a gate electrode, a source electrode, and a drain electrode, and
   the pad area includes a same material as the source electrode and the drain electrode.

16. The apparatus as claimed in claim 1, further comprising:
   an encapsulation layer encapsulating the display area,
   wherein the encapsulation layer includes an inorganic layer and an organic layer.

17. A display, comprising:
   a flexible substrate;
   a support layer on the flexible substrate;
   an integrated circuit on the flexible substrate; and
   an adhesion layer between the support layer and the flexible substrate,
   wherein the adhesion layer has a first thickness in an area corresponding to the integrated circuit and a second thickness in another area, the first thickness different from the second thickness in the another area.

18. The display as claimed in claim 17, wherein the first thickness is less than the second thickness.

19. The display as claimed in claim 17, wherein the support layer and the integrated circuit are on opposing surfaces of the flexible substrate.

20. The display as claimed in claim 17, further comprising:
   an intermediate layer between the integrated circuit and the flexible substrate, the intermediate layer including conductive particles dispersed throughout a host material.

* * * * *